United States Patent
Liao et al.

(10) Patent No.: US 12,270,846 B2
(45) Date of Patent: Apr. 8, 2025

(54) MEASURING SYSTEM AND MEASURING METHOD OF ANTENNA PATTERN BASED ON NEAR FIELD TO FAR FIELD TRANSFORMATION

(71) Applicant: Chunghwa Telecom Co., Ltd., Taoyuan (TW)

(72) Inventors: Chang-Lun Liao, Taoyuan (TW); You-Hua Lin, Taoyuan (TW); Jiahn-Wei Lin, Taoyuan (TW); Bo-Cheng You, Taoyuan (TW); Chang-Fa Yang, Taoyuan (TW); De-Xian Song, Taoyuan (TW); Wen-Jiao Liao, Taoyuan (TW); Yuan-Chang Hou, Taoyuan (TW); Tswen-Jiann Huang, Taoyuan (TW)

(73) Assignee: Chunghwa Telecom Co., Ltd., Taoyuan (TW)

( * ) Notice: Subject to any disclaimer, the term of this patent is extended or adjusted under 35 U.S.C. 154(b) by 212 days.

(21) Appl. No.: 18/322,580

(22) Filed: May 23, 2023

(65) Prior Publication Data

US 2024/0329108 A1     Oct. 3, 2024

(30) Foreign Application Priority Data

Mar. 29, 2023    (TW) .................................. 112112054

(51) Int. Cl.
    *G01R 29/08*       (2006.01)
    *G01R 29/10*       (2006.01)

(52) U.S. Cl.
    CPC ....... *G01R 29/0814* (2013.01); *G01R 29/105* (2013.01)

(58) Field of Classification Search
    CPC ...... G01R 29/10; G01R 29/14; G01R 29/105; H04B 17/102; H04B 7/0617; H04B 17/16; H01Q 3/267
    See application file for complete search history.

(56) References Cited

U.S. PATENT DOCUMENTS 6,191,744 B1 *    2/2001    Snow ..................... G01R 29/10
                                                                                343/765
6,895,091 B1      5/2005    Elliott et al.
(Continued)

FOREIGN PATENT DOCUMENTS

CN        109273851       1/2019
CN        111707877       9/2020

OTHER PUBLICATIONS

Takashi Kawamura et al., "Near-Field Measurement System for 5G Massive MIMO Base Stations", Anritsu Technical Review No. 25, Sep. 2017, pp. 30-37.
(Continued)

*Primary Examiner* — Monica C King
(74) *Attorney, Agent, or Firm* — JCIPRNET

(57) ABSTRACT

A measuring system and a measuring method of an antenna pattern based on near field to far field transformation (NFTF) are provided. The measuring system includes a probe antenna, a reference antenna, and a control system. The probe antenna measures an electric field radiated by an antenna under test to obtain electric field information. The reference antenna measures the electric field to obtain a reference phase. The control system is coupled to the antenna under test, the probe antenna, and the reference antenna, wherein the control system applies near field focusing to the reference antenna to configure a focus point of the reference antenna on the antenna under test, and the control system performs the NFTF according to the electric field
(Continued)

information and the reference phase to output far field patterns.

14 Claims, 4 Drawing Sheets

(56) References Cited

U.S. PATENT DOCUMENTS

| | | | |
|---|---|---|---|
| 7,236,597 B2 | 6/2007 | Elliott et al. | |
| 7,876,276 B1* | 1/2011 | Zaman | H01Q 3/08 343/703 |
| 12,188,970 B2* | 1/2025 | Wang | H04B 17/0085 |
| 2024/0369608 A1* | 11/2024 | Deckert | G01R 29/10 |
| 2024/0372633 A1* | 11/2024 | Deckert | G01R 29/10 |

OTHER PUBLICATIONS

Chang-Lun Liao et al., "Using a VNA Based Spherical Near Field Antenna Measurement System for Active Antenna System Performance Verifications", 2022 Antenna Measurement Techniques Association Symposium (AMTA), Oct. 13, 2022, pp. 1-5.

* cited by examiner

MEASURING SYSTEM AND MEASURING METHOD OF ANTENNA PATTERN BASED ON NEAR FIELD TO FAR FIELD TRANSFORMATION

CROSS-REFERENCE TO RELATED APPLICATION

This application claims the priority benefit of Taiwan application serial no. 112112054, filed on Mar. 29, 2023. The entirety of the above-mentioned patent application is hereby incorporated by reference herein and made a part of this specification.

BACKGROUND

Technical Field

This disclosure relates to a wireless communication technology, and particularly to a measuring system and a measuring method of an antenna pattern based on near field to far field transformation.

Description of Related Art

In recent years, services based on 5G networks have gradually become popular. Unlike the antenna system of 4G networks, the active antenna system and the radio frequency module at the base station end of 5G networks are highly integrated. The active antenna system only has a digital signal port based on Ethernet network for control or connection to upper-layer transmission networks, and does not have an independent radio frequency signal port. Measurement personnel cannot use a network analyzer to provide a radio frequency signal to the active antenna through the radio frequency signal port for passive antenna pattern measurement. Therefore, measurement personnel can only measure the radiation pattern of the active antenna through over-the-air (OTA) measurement.

The 3rd Generation Partnership Project (3GPP) under the International Telecommunication Union has divided the pattern measuring manners for the active antenna system of 5G networks into three types, including direct far field (DFF), indirect far field (IFF), and near field to far field transformation (NFTF).

The direct far field is the most intuitive and the simplest measurement manner, in which the antenna under test is set in a quiet zone (QZ) to measure the radiation pattern of the antenna under test. However, the distance between the quiet zone and the probe antenna must satisfy the far field condition of $2D^2/\lambda$, where D is the size of the antenna under test and $\lambda$ is the wavelength of the electromagnetic wave radiated from the antenna under test. To satisfy this far field condition, especially in high-frequency bands (such as millimeter-wave bands), large measurement environments and facilities are required since the wavelength is short and array antennas are usually used for this type of antenna applications, which have large dimensions in wavelengths. Therefore, the application of the direct far field method is costly. The indirect far field method is the compact antenna test range (CATR) method. This method can satisfy the far field condition in a compact space.

The near field to far field transformation method is to capture the amplitude and phase distributions of the electromagnetic waves in the near field of the antenna under test in the radiation near field (at a distance of approximately 3-5 times the wavelength), calculate an equivalent far field pattern according to the mathematical theory of the near field to far field transformation, and observe the equivalent current surface of the antenna through the back projection technique, thereby diagnosing the defective units inside the antenna. Compared to the previous two methods, the near field to far field transformation method can better measure the detailed operational status of the active antenna system, thereby providing better debugging or optimization information for the research end or the product testing end. Therefore, how to capture the electric field more accurately in the radiation near field region is one of the important issues in this field.

SUMMARY

The disclosure provides a measuring system of an antenna pattern based on near field to far field transformation, which can reduce noise received when measuring an antenna under test.

A measuring system of an antenna pattern based on near field to far field transformation of the disclosure is adapted to an antenna under test and includes a probe antenna, a reference antenna, and a control system. The probe antenna measures an electric field radiated by the antenna under test to obtain electric field information. The reference antenna measures the electric field to obtain a reference phase. The control system is coupled to the antenna under test, the probe antenna, and the reference antenna. The control system applies near field focusing to the reference antenna to configure a focus point of the reference antenna on the antenna under test. The control system performs near field to far field transformation according to the electric field information and the reference phase to output far field patterns.

In an embodiment of the disclosure, the reference antenna includes an antenna array.

In an embodiment of the disclosure, the antenna array includes at least three antenna units arranged in a row. The control system configures multiple phase differences between the at least three antenna units to apply the near field focusing. The at least three antenna units include a first antenna unit and a second antenna unit disposed at a relative position of the first antenna unit. A phase difference between the first antenna unit and the second antenna unit is zero.

In an embodiment of the disclosure, the measuring system further includes a moving mechanism. The moving mechanism is communicatively connected to the control system. The probe antenna is disposed on the moving mechanism. The control system moves the probe antenna through the moving mechanism to measure the electric field.

In an embodiment of the disclosure, the measuring system further includes an absorber. The absorber covers the moving mechanism.

In an embodiment of the disclosure, the measuring system further includes a shaft. The shaft is communicatively connected to the control system. The antenna under test is disposed on the shaft. The control system rotates the antenna under test through the shaft. During rotation of the antenna under test, a relative position between the reference antenna and the antenna under test remains unchanged.

A measuring system of an antenna pattern based on near field to far field transformation of the disclosure is adapted to an antenna under test and includes a probe antenna, a reference antenna, and a control system. The probe antenna measures an electric field radiated by the antenna under test to obtain electric field information. The electric field includes a main beam. The reference antenna measures the electric field to obtain a reference phase. The control system is coupled to the antenna under test, the probe antenna, and the reference antenna. The control system configures the reference antenna to minimize a receiving gain of the reference antenna in a direction of the main beam. The control system performs near field to far field transformation according to the electric field information and the reference phase to output far field patterns.

In an embodiment of the disclosure, the reference antenna includes an antenna array.

In an embodiment of the disclosure, the antenna array includes a first antenna unit and a second antenna unit. The first antenna unit has a first main receiving beam pointing to the direction of the main beam. The second antenna unit has a second main receiving beam pointing to the direction of the main beam. A phase difference between the first antenna unit and the second antenna unit is 180 degrees.

In an embodiment of the disclosure, the measuring system further includes a moving mechanism. The moving mechanism is communicatively connected to the control system. The probe antenna is disposed on the moving mechanism. The control system moves the probe antenna through the moving mechanism to measure the electric field.

In an embodiment of the disclosure, the measuring system further includes an absorber. The absorber covers the moving mechanism.

In an embodiment of the disclosure, the measuring system further includes a shaft. The shaft is communicatively connected to the control system. The antenna under test is disposed on the shaft. The control system rotates the antenna under test through the shaft. During rotation of the antenna under test, a relative position between the reference antenna and the antenna under test remains unchanged.

A measuring method of an antenna pattern based on near field to far field transformation of the disclosure is adapted to an antenna under test and includes the following steps. An electric field radiated by the antenna under test is measured by a probe antenna to obtain electric field information. The electric field is measured by a reference antenna to obtain a reference phase. Near field focusing is applied to the reference antenna by a control system to configure a focus point of the reference antenna on the antenna under test. Near field to far field transformation is performed by the control system according to the electric field information and the reference phase to output far field patterns.

A measuring method of an antenna pattern based on near field to far field transformation of the disclosure is adapted to an antenna under test and includes the following steps. An electric field radiated by the antenna under test is measured by a probe antenna to obtain electric field information. The electric field includes a main beam. The electric field is measured by a reference antenna to obtain a reference phase. The reference antenna is configured by the control system to minimize a receiving gain of the reference antenna in a direction of the main beam. Near field to far field transformation is performed by the control system according to the electric field information and the reference phase to output an estimated far field pattern.

Based on the above, the disclosure applies near field focusing to the reference antenna to configure the focus point of the reference antenna on the antenna under test, thereby improving the receiving gain of the near field radiation of the probe antenna by the reference antenna. The disclosure can minimize the receiving gain of the reference antenna in the direction of the main beam of the antenna under test, thereby reducing the interference caused by the reflected signal of the main beam to the reception of the antenna under test. The disclosure can reduce the reflected signal generated by the moving mechanism by covering the moving mechanism for disposing the probe antenna by the absorber.

DESCRIPTION OF THE EMBODIMENTS

Figure 1:
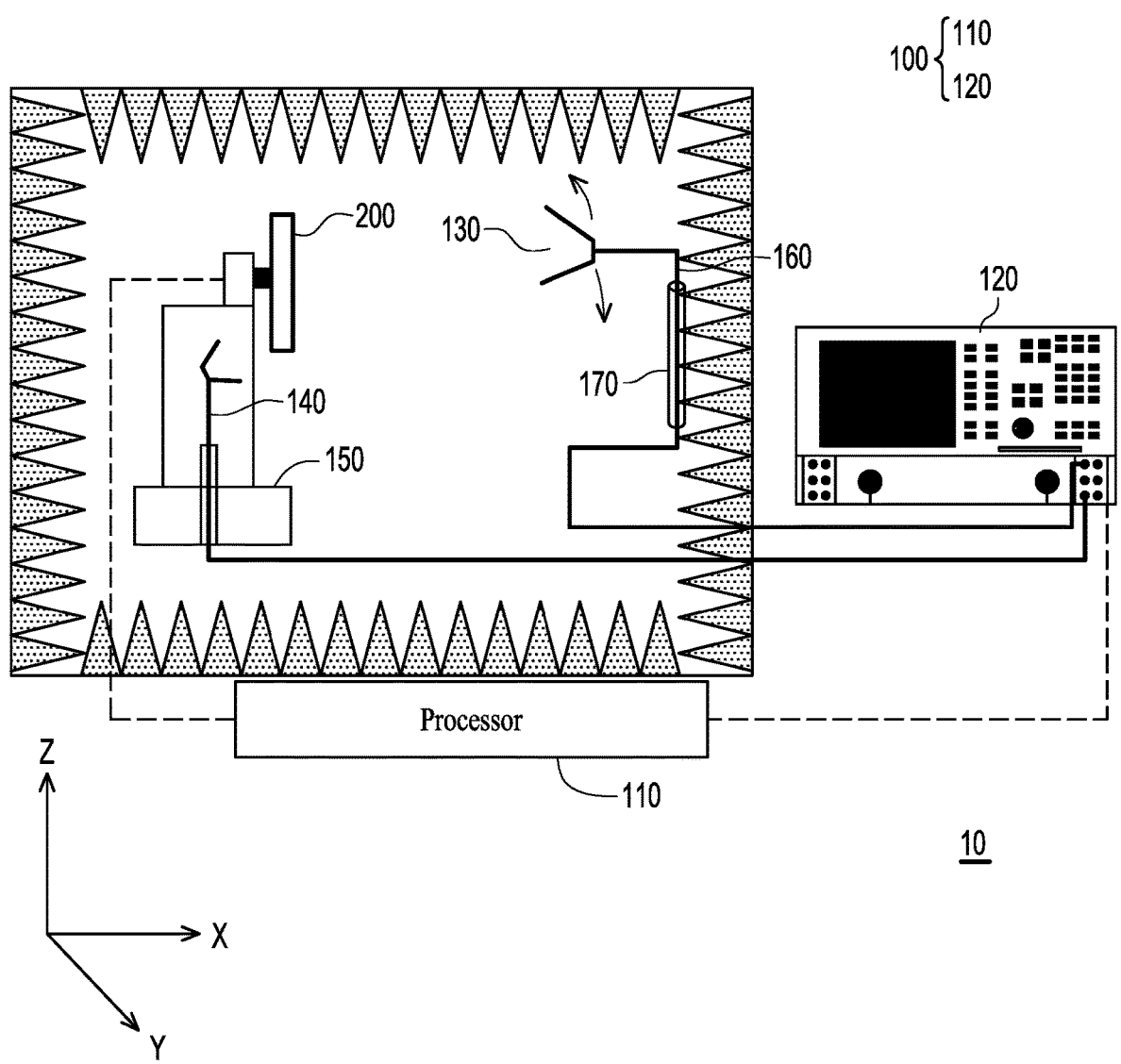
FIG. 1 is a schematic diagram of a measuring system of an antenna pattern based on near field to far field transformation according to an embodiment of the disclosure.

In order to make the content of the disclosure more comprehensible, the following specific embodiments are provided as examples that may truly be used to implement the disclosure. In addition, wherever possible, components/structures/steps with the same reference numerals used in the drawings and embodiments represent the same or similar parts.

FIG. 1 is a schematic diagram of a measuring system 10 of an antenna pattern based on near field to far field transformation according to an embodiment of the disclosure. The measuring system 10 is adapted to measure the amplitude and phase distribution of an electric field in the near field of an antenna under test 200, and calculate the far field pattern of the antenna under test 200 according to the information (including amplitude and phase) measured in the near field. The antenna under test 200 may be, for example, an active antenna adapted for 5G communication technology. The measuring system 10 may include a control system 100, a probe antenna 130, and a reference antenna 140. In an embodiment, the measuring system 10 may further include a shaft 150, a moving mechanism 160, and an absorber 170. The measuring system 10 may be disposed in an anechoic chamber environment.

The control system 100 may be coupled to the antenna under test 200, the probe antenna 130, the reference antenna 140, the shaft 150, and the moving mechanism 160. Specifically, the control system 100 may include a processor 110 and a network analyzer 120 communicatively connected to the processor 110. The processor 110 may be communicatively connected to the antenna under test 200, the reference antenna 140, the shaft 150, and the moving mechanism 160, and may control the radiation electric field of the antenna under test 200. The network analyzer 120 may be communicatively connected to the probe antenna 130 and the reference antenna 140, and may obtain a signal received by the probe antenna 130 and a signal received by the reference antenna 140 respectively from the probe antenna 130 and the reference antenna 140.

The probe antenna 130 is configured to measure the electric field radiated by the antenna under test 200 to obtain electric field information, wherein the electric field information may include the amplitude and phase of the electric field in the near field. The probe antenna 130 may be disposed on the moving mechanism 160. The processor 110 may be communicatively connected to the moving mechanism 160 and may control the moving mechanism 160 to move during a measurement period of the electric field of the antenna under test 200, so as to change the trim angle of the probe antenna 130. In other words, the processor 110 may move the probe antenna 130 through the moving mechanism 160 to measure the electric field of the antenna under test 200. Taking FIG. 1 as an example, the processor 110 may control the moving mechanism 160 to move the position of the probe antenna 130 on the XZ plane. It should be noted that when the probe antenna 130 moves on the XZ plane, the distance between the probe antenna 130 and the antenna under test 200 may remain unchanged.

When the OTA measurement manner is used to measure the near field pattern of the antenna under test 200, since the antenna under test 200 does not use the network analyzer 120 as the input source, the calculation of the phase change of the antenna under test 200 lacks phases used as a reference. Therefore, the reference antenna 140 may be configured to measure the reference phase of the antenna under test 200. The stability of signal reception of the reference antenna 140, the spatial configuration of the reference antenna 140, or the mutual coupling characteristics between the reference antenna 140 and the antenna under test 200 are all key factors in accurately measuring the far field pattern of the antenna under test 200. The reference antenna 140 is configured to measure the electric field radiated by the antenna under test 200 to obtain the reference phase. The reference antenna 140 may be disposed near the antenna under test 200, and the relative position between the reference antenna 140 and the antenna under test 200 remains unchanged. Specifically, the antenna under test 200 may be disposed on the shaft 150. The processor 110 may be communicatively connected to the shaft 150 and may control the shaft 150 to rotate along the Z-axis during the measurement period of the electric field of the antenna under test 200. In other words, the processor 110 may rotate the antenna under test 200 through the shaft 150 to measure the electric field of the antenna under test 200. During the rotation period of the antenna under test 200 along with the shaft 150, the relative position between the reference antenna 140 and the antenna under test 200 remains unchanged. For instance, the reference antenna 140 may be disposed on the shaft 150 or on the antenna under test 200. When the antenna under test 200 rotates along with the shaft 150, the reference antenna 140 also rotates along with the shaft 150. Based on this, the relative position between the reference antenna 140 and the antenna under test 200 may remain unchanged.

The electric field radiated by the antenna under test 200 may be reflected by the moving mechanism 160 to generate a reflected signal, wherein the reflected signal may interfere with the value of the reference phase measured by the reference antenna 140. To reduce the reflected signal generated by the moving mechanism 160, the absorber 170 may be configured for the measuring system 10. The absorber 170 may cover the moving mechanism 160. When the radio frequency signal radiated by the antenna under test 200 is transmitted to the moving mechanism 160, the absorber 170 may reduce the cross-sectional area of the scattered radio frequency signal, thereby reducing the intensity of the reflected signal.

After the probe antenna 130 measures the electric field radiated by the antenna under test 200 and obtains the electric field information (i.e. amplitude and phase), and the reference antenna 140 measures the electric field radiated by the antenna under test 200 and obtains the reference phase, the processor 110 of the control system 100 may obtain the electric field information and the reference phase from the network analyzer 120, and performs near field to far field transformation according to the electric field information and the reference phase to obtain the far field pattern. Then, the processor 110 may output the information of the far field pattern for the user's reference. For example, the processor 110 may output the far field pattern to the terminal device (e.g. personal computer) of the user.

In order to more accurately measure the reference phase of the electric field of the antenna under test 200, the control system 100 may configure the reference antenna 140 to increase the receiving gain of the reference antenna 140 from the antenna under test 200. In an embodiment, the processor 110 of the control system 100 may apply near field focusing to the reference antenna 140 to configure a focus point of the reference antenna 140 on the antenna under test 200, thereby maximizing the receiving gain of the reference antenna 140 from the antenna under test 200. The beam radiated by the reference antenna 140 designed with near field focusing may generate constructive interference at the focus point to enhance the receiving gain of the near field signal. For example, if the reference antenna 140 is 5 cm away from the antenna under test 200, the focus point of the reference antenna 140 may be configured 5 cm away from the reference antenna 140.

Figure 2A:
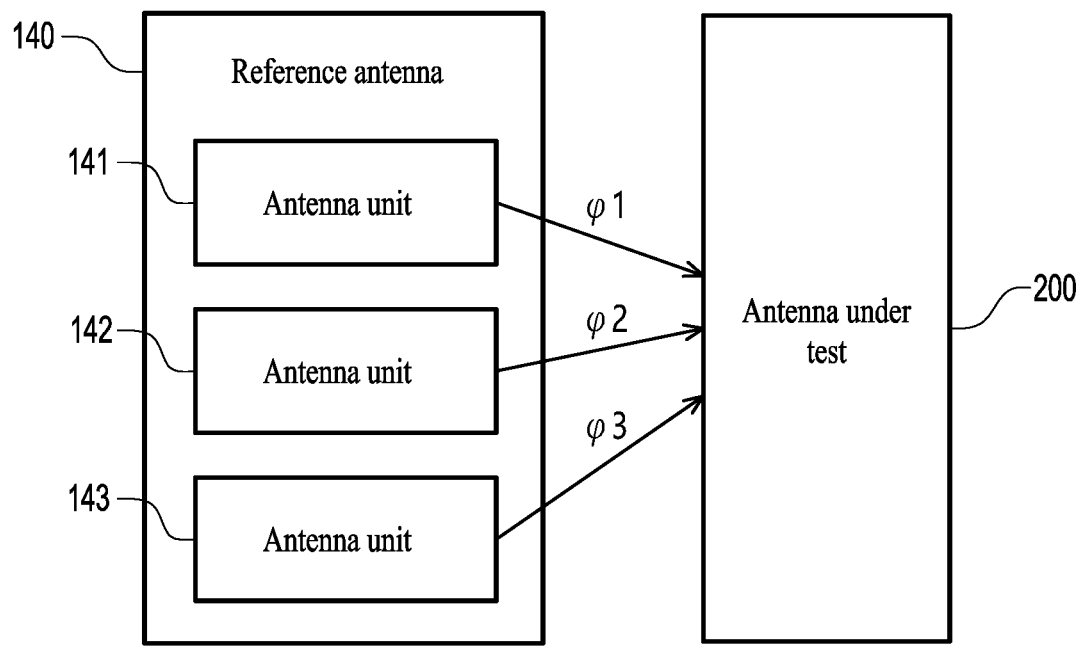
FIGS. 2A and 2B are schematic diagrams of a reference antenna applying near field focusing according to an embodiment of the disclosure.
Figure 2B:
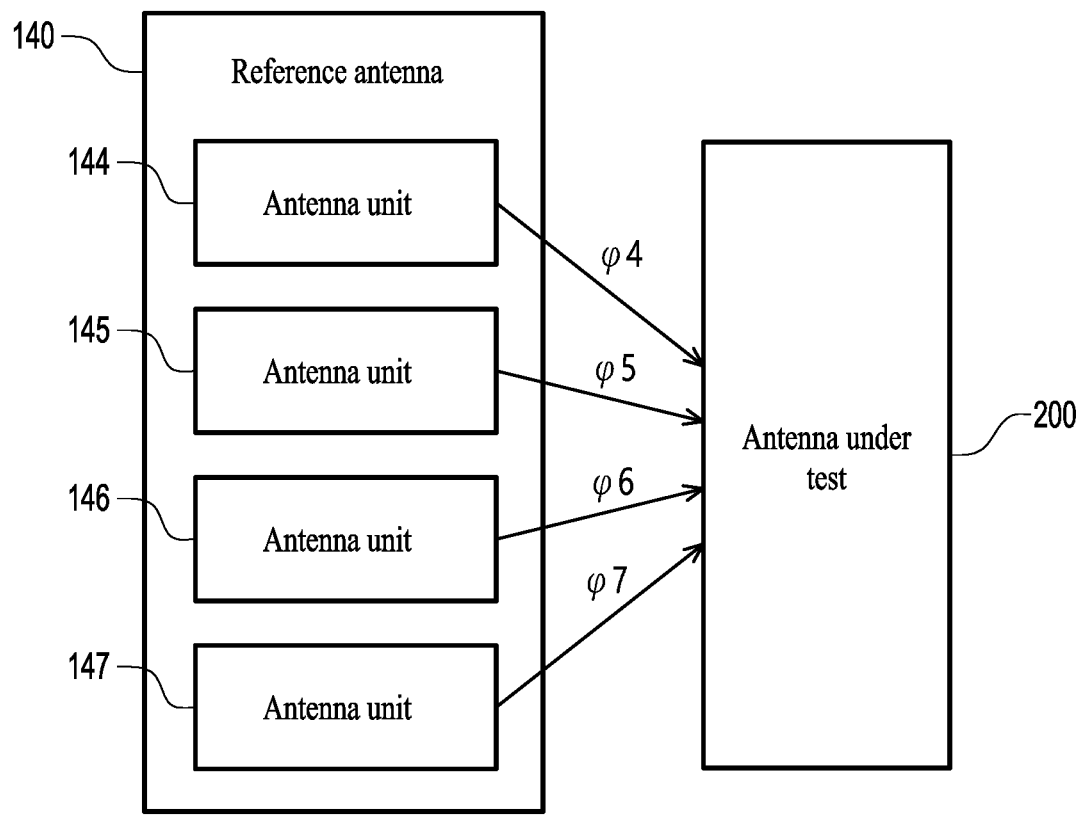

FIGS. 2A and 2B are schematic diagrams of a reference antenna 140 applying near field focusing according to an embodiment of the disclosure. The reference antenna 140 may include an antenna array, wherein the antenna array may include at least three antenna units, such as an antenna unit 141, an antenna unit 142, and an antenna unit 143 shown in FIG. 2A, arranged in a row. The antenna units may be interconnected through a power divider circuit. The processor 110 of the control system 100 may configure multiple phase differences between the at least three antenna units to apply near field focusing to the reference antenna 140, so as to configure the focus point of the reference antenna 140 on the antenna under test 200. It is assumed that the at least three antenna units include a first antenna unit and a second antenna unit disposed at a relative position of the first antenna unit. For example, if the first antenna unit is disposed at the Nth position from the front end of the antenna array, the second antenna unit may be disposed at the Nth position from the rear end of the antenna array, where N is a positive integer. The processor 110 may configure the phase of the first antenna unit and the phase of the second antenna unit, so that the phase difference between the first antenna unit and the second antenna unit is zero.

Taking FIG. 2A as an example, the antenna unit 141 is disposed at the first position from the front end of the antenna array and the antenna unit 143 is disposed at the first position from the rear end of the antenna array. The processor 110 may configure a phase φ1 of the antenna unit 141 and a phase φ3 of the antenna unit 143, so that the phase difference between the antenna unit 141 and the antenna unit 143 is zero. For example, the phase φ1 of the antenna unit 141, a phase φ2 of the antenna unit 142, and the phase φ3 of the antenna unit 143 may be 0 degrees, −85 degrees, and 0 degrees, respectively. Similarly, it is assumed that the reference antenna 140 includes four antenna units, such as an antenna unit 144, an antenna unit 145, an antenna unit 146, and an antenna unit 147 shown in FIG. 2B. The antenna units may be interconnected through a power divider circuit. The processor 110 may configure the phase of each antenna unit, so that the phase difference between the antenna unit at the first position from the front end of the antenna array (i.e., the antenna unit 144) and the antenna unit at the first position from the rear end of the antenna array (i.e., the antenna unit 147) is zero, and the phase difference between the antenna unit at the second position from the front end of the antenna array (i.e., the antenna unit 145) and the antenna unit at the second position from the rear end of the antenna array (i.e., the antenna unit 146) is zero. In other words, the difference between a phase φ4 of the antenna unit 144 and a phase φ7 of the antenna unit 147 may be zero, and the difference between a phase φ5 of the antenna unit 145 and a phase φ6 of the antenna unit 146 may be zero.

If the moving mechanism 160 appears in the direction of the main beam of the antenna under test 200 (i.e. the beam with the maximum gain of the antenna under test 200), the main beam reflected by the moving mechanism 160 will seriously interfere with the measurement result of the reference phase by the reference antenna 140. In order to reduce the interference of the reflected signal or the scattered signal of the electric field radiated by the antenna under test 200 on the measurement result of the reference phase, the disclosure adopts a design similar to differential mode for the reference antenna 140. The control system 100 may apply a far field amplitude null field to the reference antenna 140, so as to minimize the receiving gain of the reference antenna 140 in the direction of the main beam of the antenna under test 200.

Figure 3:
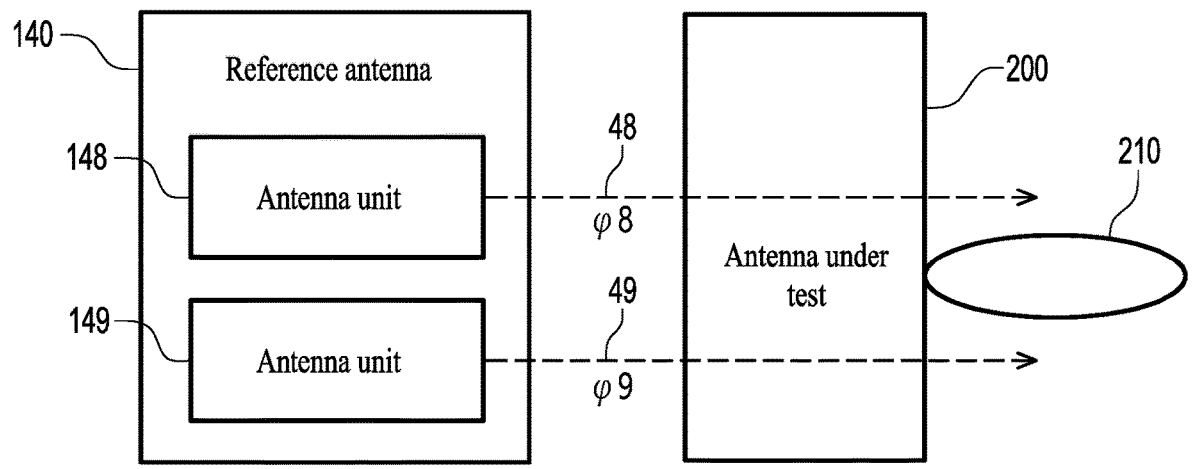
FIG. 3 is a schematic diagram of a reference antenna applying a far field amplitude null field according to an embodiment of the disclosure.

FIG. 3 is a schematic diagram of a reference antenna 140 applying a far field amplitude null field according to an embodiment of the disclosure. The reference antenna 140 may include an antenna array, wherein the antenna array may include at least two antenna units, such as an antenna unit 148 and an antenna unit 149 shown in FIG. 3, arranged in a row. The antenna units in the antenna array may have a main receiving beam (i.e., the beam with the maximum gain among all the beams of the reference antenna 140) pointing to the direction of the main beam of the antenna under test 200 (i.e., the beam with the maximum gain among all the beams of the antenna under test 200), and the phase difference between the antenna units may be 180 degrees. The antenna units may be interconnected by a power divider circuit. For example, it is assumed that the main beam of the antenna under test 200 is a main beam 210 shown in FIG. 3, the antenna unit 148 in the antenna array of the reference antenna 140 may have a main receiving beam 48 pointing to the direction of the main beam 210, and the antenna unit 149 may have a main receiving beam 49 pointing to the direction of the main beam 210. The phase difference between a phase φ8 of the main receiving beam 48 and a phase φ9 of the main receiving beam 49 may be 180 degrees. The processor 110 configuring the main receiving beam of the antenna unit (e.g., the antenna unit 148 or 149) to point to the direction of the main beam 210 may represent that the processor 110 configures the main receiving beam of the antenna unit to maximize an overlap region between the main receiving beam of the antenna unit and the main beam 210 of the antenna under test 200, that is, the processor 110 makes the main receiving beam of the antenna unit overlap with the main beam 210 as much as possible. When the main receiving beam 48 of the antenna unit 148 and the main receiving beam 49 of the antenna unit 149 both overlap with the main beam 210, the main receiving beam 48 and the main receiving beam 49 may form a null field at the position of the main beam 210, thereby minimizing the receiving gain of the reference antenna 140 in the direction of the main beam 210 of the antenna under test 200.

Figure 4:
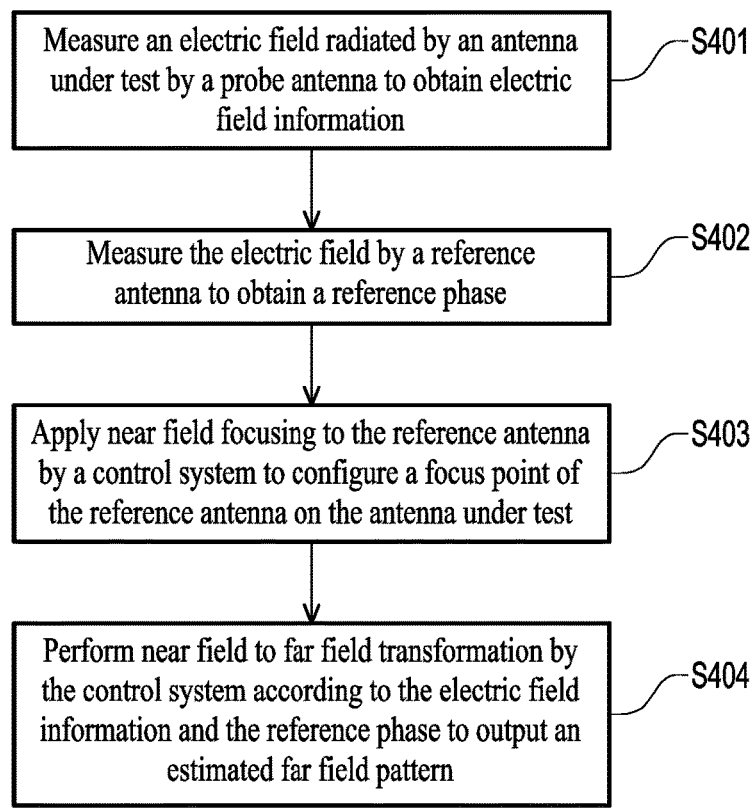
FIG. 4 is a flowchart of a measuring method of an antenna pattern based on near field to far field transformation according to an embodiment of the disclosure.

FIG. 4 is a flowchart of a measuring method for an antenna pattern based on near field to far field transformation according to an embodiment of the disclosure. The measuring method is adapted to the antenna under test 200 and may be implemented by the measuring system 10 shown in FIG. 1. In Step S401, an electric field radiated by an antenna under test is measured by a probe antenna to obtain electric field information. In Step S402, the electric field is measured by a reference antenna to obtain a reference phase. In Step S403, near field focusing is applied to the reference antenna by a control system to configure a focus point of the reference antenna on the antenna under test. In Step S404, near field to far field transformation is performed by the control system according to the electric field information and the reference phase to output a far field pattern.

Figure 5:
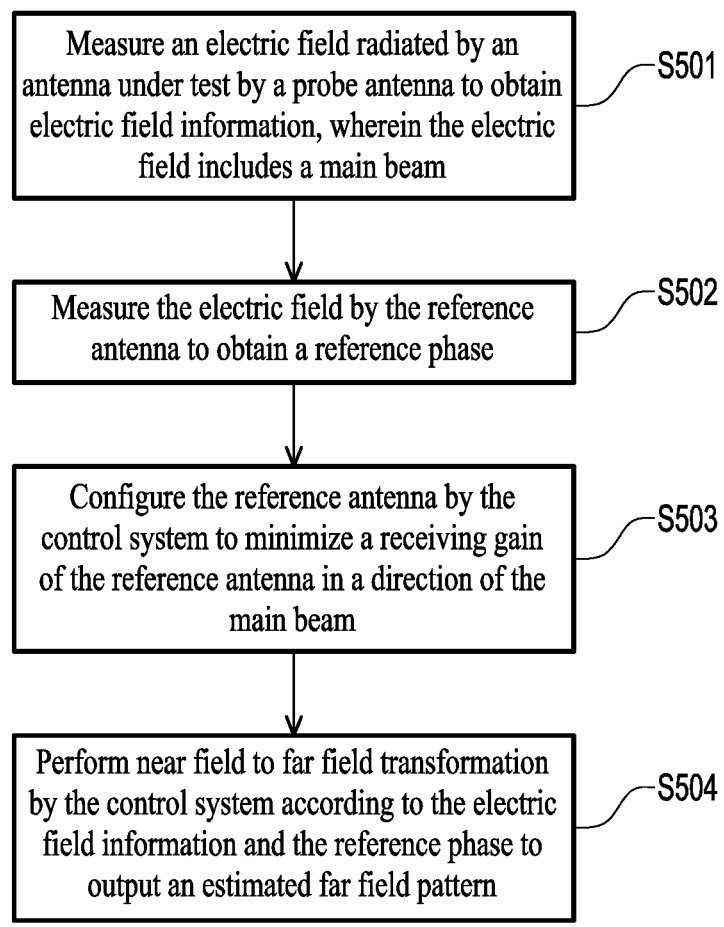
FIG. 5 is a flowchart of another measuring method of an antenna pattern based on near field to far field transformation according to an embodiment of the disclosure.

FIG. 5 is another flowchart of a measuring method for an antenna pattern based on near field to far field transformation according to an embodiment of the disclosure. The measuring method is adapted to the antenna under test 200 and may be implemented by the measuring system 10 shown in FIG. 1. In Step S501, an electric field radiated by an antenna under test is measured by a probe antenna to obtain electric field information, wherein the electric field includes a main beam. In Step S502, the electric field is measured by a reference antenna to obtain a reference phase. In Step S503, the reference antenna is configured by a control system to minimize a receiving gain of the reference antenna in a direction of the main beam. In Step S504, near field to far field transformation is performed by the control system according to the electric field information and the reference phase to output a far field pattern.

In summary, in the disclosure, a single reference antenna may be disposed near the active antenna, and an absorber may be used to cover the mechanism that easily generates scattering waves to prevent the reflected signal from interfering the accuracy of the reference phase captured by the reference antenna. The disclosure can use near field focusing to improve the quality of signal reception of the reference antenna. The disclosure can increase the near field coupling ability of the active antenna and improve the stability of phase extraction and comparison. The disclosure can also weaken the radiation gain of the far field pattern to reduce signal interference caused by scattering effects. In the disclosure, the structure of the reference antenna may be designed based on far field amplitude null field to reduce the receiving gain of the reference antenna in the direction of the main beam of the antenna under test, thereby enhancing the anti-interference effect of the reference antenna.

What is claimed is:

1. A measuring system for an antenna pattern based on near field to far field transformation, adapted to an antenna under test, comprising:
   a probe antenna, measuring an electric field radiated by the antenna under test to obtain electric field information;
   a reference antenna, measuring the electric field to obtain a reference phase; and
   a control system, coupled to the antenna under test, the probe antenna, and the reference antenna, wherein
   the control system applies near field focusing to the reference antenna to configure a focus point of the reference antenna on the antenna under test, and
   the control system performs the near field to far field transformation according to the electric field information and the reference phase to output far field patterns.

2. The measuring system of claim 1, wherein the reference antenna comprises an antenna array.

3. The measuring system of claim 2, wherein the antenna array comprises at least three antenna units arranged in a row, the control system configures a plurality of phase differences between the at least three antenna units to apply the near field focusing, the at least three antenna units comprise a first antenna unit and a second antenna unit disposed at a relative position of the first antenna unit, and a phase difference between the first antenna unit and the second antenna unit is zero.

4. The measuring system of claim 1, further comprising:
a moving mechanism, communicatively connected to the control system, wherein the probe antenna is disposed on the moving mechanism, wherein
the control system moves the probe antenna through the moving mechanism to measure the electric field.

5. The measuring system of claim 4, further comprising:
an absorber covering the moving mechanism.

6. The measuring system of claim 1, further comprising:
a shaft, communicatively connected to the control system, wherein the antenna under test is disposed on the shaft, wherein
the control system rotates the antenna under test through the shaft, and
during a rotation period of the antenna under test, a relative position between the reference antenna and the antenna under test remains unchanged.

7. A measuring system for an antenna pattern based on near field to far field transformation, adapted to an antenna under test, comprising:
a probe antenna, measuring an electric field radiated by the antenna under test to obtain electric field information, wherein the electric field comprises a main beam;
a reference antenna, measuring the electric field to obtain a reference phase; and
a control system, coupled to the antenna under test, the probe antenna, and the reference antenna, wherein
the control system configures the reference antenna to minimize a receiving gain of the reference antenna in a direction of the main beam, and
the control system performs the near field to far field transformation according to the electric field information and the reference phase to output far field patterns.

8. The measuring system of claim 7, wherein the reference antenna comprises an antenna array.

9. The measuring system of claim 8, wherein the antenna array comprises:
a first antenna unit, having a first main receiving beam pointing to the direction of the main beam; and
a second antenna unit, having a second main receiving beam pointing to the direction of the main beam, wherein
a phase difference between the first antenna unit and the second antenna unit is 180 degrees.

10. The measuring system of claim 7, further comprising:
a moving mechanism, communicatively connected to the control system, wherein the probe antenna is disposed on the moving mechanism, wherein
the control system moves the probe antenna through the moving mechanism to measure the electric field.

11. The measuring system of claim 10, further comprising:
an absorber, covering the moving mechanism.

12. The measuring system of claim 7, further comprising:
a shaft, communicatively connected to the control system, wherein the antenna under test is disposed on the shaft, wherein
the control system rotates the antenna under test through the shaft, and
during a rotation period of the antenna under test, a relative position between the reference antenna and the antenna under test remains unchanged.

13. A measuring method for an antenna pattern based on near field to far field transformation, adapted to an antenna under test, comprising:
measuring an electric field radiated by the antenna under test by a probe antenna to obtain electric field information;
measuring the electric field by a reference antenna to obtain a reference phase;
applying near field focusing to the reference antenna by a control system to configure a focus point of the reference antenna on the antenna under test; and
performing the near field to far field transformation by the control system according to the electric field information and the reference phase to output far field patterns.

14. A measuring method for an antenna pattern based on near field to far field transformation, adapted to an antenna under test, comprising:
measuring an electric field radiated by the antenna under test by a probe antenna to obtain electric field information, wherein the electric field comprises a main beam;
measuring the electric field by a reference antenna to obtain a reference phase;
configuring the reference antenna by a control system to minimize a receiving gain of the reference antenna in a direction of the main beam; and
performing the near field to far field transformation by the control system according to the electric field information and the reference phase to output far field patterns.

* * * * *